United States Patent
Master et al.

(10) Patent No.: US 6,812,570 B2
(45) Date of Patent: Nov. 2, 2004

(54) ORGANIC PACKAGES HAVING LOW TIN SOLDER CONNECTIONS

(75) Inventors: Raj N. Master, San Jose, CA (US); Mohammad Zubair Khan, San Jose, CA (US); Maria Guardado, San Jose, CA (US); Charles Anderson, Los Altos, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 65 days.

(21) Appl. No.: 10/184,061

(22) Filed: Jun. 28, 2002

(65) Prior Publication Data

US 2003/0037959 A1 Feb. 27, 2003

Related U.S. Application Data

(63) Continuation-in-part of application No. 09/482,102, filed on Jan. 13, 2000, now abandoned.
(60) Provisional application No. 60/171,299, filed on Dec. 21, 1999.

(51) Int. Cl.[7] .......................... H01L 23/48; H05K 9/00; H05K 1/09
(52) U.S. Cl. .................. 257/745; 257/779; 257/786; 361/808; 174/256
(58) Field of Search .................. 420/558, 559, 420/562, 570, 563–565, 571, 572; 174/255–258, 260, 262; 361/767, 768, 771; 29/832, 840, 874, 875; 438/108; 257/737, 738

(56) References Cited

U.S. PATENT DOCUMENTS

| | | |
|---|---|---|
| 3,392,442 A | 7/1968 | Napier et al. |
| 4,170,472 A | 10/1979 | Olsen et al. |
| 4,290,079 A | 9/1981 | Carpenter et al. |
| 4,824,009 A | 4/1989 | Master et al. |
| 5,102,829 A | 4/1992 | Cohn |
| 5,154,341 A | 10/1992 | Melton et al. |
| 5,206,713 A * | 4/1993 | McGeary ............... 257/684 |
| 5,237,130 A | 8/1993 | Kulesza et al. |
| 5,288,944 A | 2/1994 | Bronson et al. |
| 5,303,862 A | 4/1994 | Bross et al. |
| 5,366,692 A * | 11/1994 | Ogashiwa ............... 420/565 |
| 5,468,655 A | 11/1995 | Greer |
| 5,468,995 A | 11/1995 | Higgins, III |
| 5,483,421 A | 1/1996 | Gedney et al. |
| 5,521,440 A * | 5/1996 | Iranmanesh ............. 257/774 |
| 5,535,101 A * | 7/1996 | Miles et al. ............. 361/808 |
| 5,541,450 A | 7/1996 | Jones et al. |
| 5,598,036 A | 1/1997 | Ho |
| 5,615,477 A * | 4/1997 | Sweitzer ................. 29/840 |
| 5,625,166 A | 4/1997 | Natarajan |
| 5,625,944 A | 5/1997 | Werther |
| 5,640,047 A | 6/1997 | Nakashima |
| 5,641,990 A | 6/1997 | Chiu |
| 5,690,890 A * | 11/1997 | Kawashima et al. ...... 420/559 |
| 5,831,336 A | 11/1998 | DiGiacomo |
| 5,834,839 A | 11/1998 | Mertol |
| 5,847,929 A | 12/1998 | Bernier et al. |
| 5,847,936 A | 12/1998 | Forehand et al. |
| 5,868,304 A | 2/1999 | Brofman et al. |
| 5,907,187 A | 5/1999 | Koiwa et al. |
| 5,938,862 A | 8/1999 | Yeh et al. |

(List continued on next page.)

FOREIGN PATENT DOCUMENTS

| | | |
|---|---|---|
| EP | 0 446 666 | 9/1991 |
| EP | 0 560 276 | 9/1993 |

*Primary Examiner*—Alonzo Chambliss

(57) ABSTRACT

An organic carrier member for mounting a semiconductor device is provided that has a plurality of solder pads containing low amounts of tin and bismuth. Embodiments include a bismaleimide-triazine epoxy laminate having a plurality of solder pads on the surface thereof where the solder pads contain no more than about 20 weight percent tin and has a reflow temperature of no greater than about 270° C.

17 Claims, 3 Drawing Sheets

U.S. PATENT DOCUMENTS

| | | |
|---|---|---|
| 5,948,533 A | 9/1999 | Gallagher et al. |
| 5,959,348 A | 9/1999 | Chang et al. |
| 5,990,564 A * | 11/1999 | Degani et al. .............. 257/778 |
| 6,006,428 A | 12/1999 | Feilchenfeld et al. |
| 6,013,877 A * | 1/2000 | Degani et al. .............. 174/264 |
| 6,073,829 A * | 6/2000 | Pienimaa ............... 228/180.22 |
| 6,080,650 A * | 6/2000 | Edwards .................... 438/612 |
| 6,097,610 A | 8/2000 | Hashimoto |
| 6,100,475 A * | 8/2000 | Degani et al. .............. 174/264 |
| 6,108,212 A | 8/2000 | Lach et al. |
| 6,127,731 A * | 10/2000 | Hoffmeyer .................. 257/750 |
| 6,173,489 B1 | 1/2001 | McMahon et al. |
| 6,204,558 B1 | 3/2001 | Yanagida |
| 6,224,690 B1 * | 5/2001 | Andricacos et al. ........ 148/400 |
| 6,225,687 B1 | 5/2001 | Wood |
| 6,229,207 B1 | 5/2001 | Master |
| 6,337,445 B1 * | 1/2002 | Abbott et al. ............... 174/260 |
| 6,369,451 B2 * | 4/2002 | Lin ............................ 257/779 |
| 6,465,978 B2 * | 10/2002 | Takahashi ................... 318/432 |
| 6,527,563 B2 * | 3/2003 | Clayton ....................... 439/66 |

* cited by examiner

ORGANIC PACKAGES HAVING LOW TIN SOLDER CONNECTIONS

CROSS-REFERENCE TO RELATED APPLICATION

This application is a continuation in part of and claims priority to U.S. patent application Ser. No. 09/482,102, filed Jan. 13, 2000 entitled "Organic Packages with Solders for Reliable Flip Chip Connections", now abandoned, which in turn claims priority from U.S. Provisional Application Ser. No. 60/171,299 filed Dec. 21, 1999, the entire disclosures of which are incorporated herein by reference.

FIELD OF THE INVENTION

The present invention relates to integrated circuit packages, and more particularly to an organic carrier member having low tin solders that is suitable for mounting a semiconductor device.

BACKGROUND ART

The escalating requirements for high density and performance associated with ultra-large scale integration technology creates significant challenges for the design and implementation of electrical connections between circuit components and external electrical circuitry.

Integrated circuit (IC) devices whether individual active devices, individual passive devices, multiple active devices within a single chip, or multiple passive and active dies within a single chip, require suitable input/output (I/O) connections between themselves and other circuit elements or structures. These devices are typically very small and fragile. Because of their size and fragility, they are commonly carried on substrates for support, i.e., carrier members.

Device miniaturization and the ever increasing density of semiconductor devices require an ever increasing number of I/O terminals, shorter connections and improvements in the electrical connections, heat dissipation and insulation characteristics of the carrier member. This problem is exacerbated in manufacturing semiconductor devices having a design rule of about 0.18 microns and under.

One technique that supports the increased device densities is the shift from peripheral wire bonding to area array chip interconnects. Area array chip interconnects use bumps or solder joints that directly couples the IC device, i.e., a semiconductor device, die or chip, to a carrier member. This technique accommodates an increased number of I/O terminals and provides electrical signals immediately below the chip, improving voltage noise margins and signal speed. One type of area array interconnect packaging technique is the flip chip (FC) solder interconnect on a carrier member.

In the flip chip assembly or package, the IC device and other devices are "bumped" with solder bumps or balls, i.e. a plurality of discrete solder bumps are formed over metal contacts on the surface of the chip. The chip is then turned upside down or "flipped" so that the device side or face of the IC device couples to the carrier member such as found in a ceramic or plastic carrier member having balls, pins or land grid arrays. The solder bumps of the device are then attached to the carrier member forming an electrical and mechanical connection.

As illustrated in FIG. 1, a conventional flip chip assembly 8 includes an IC semiconductor device or IC die 10 mechanically and electrically attached to substrate 16 by a plurality of solder bumps 12 connected to solder pads 14 on substrate 16. Solder pads 14 are electrically connected to terminals 18 by internal wiring (not shown for illustrative convenience) throughout substrate 16. Terminals 18 are then used to provide electrical connections to external circuitry. The assembly, thus, provides an electrical signal path from die 10 through solder/pad connections 12/14 through substrate 16, by way of internal wiring, to an external connection by way of terminals 18.

As shown, substrate 16 has a plurality of solder pads 14, which are generally formed by screen printing a coating of solder on the substrate. Solder balls 12 on die 10 are generally formed by known solder bumping techniques and are conventionally formed of a high lead (Pb) solder, such as solders having from 97–95 wt. % Pb and from 3–5 wt. % of tin (Sn), which have a melting temperature of approximately 323° C. Substrate 16 can be made of ceramic or plastic materials. When the substrate is made of a ceramic, the electrical and mechanical interconnect between the die and substrate is conventionally achieved by reflowing the solder pads 14 and solder bumps 12 at a relatively high temperature, such as at 330° C. to 400° C., to join solder bumps 12 and pads 14 between the die and substrate 16. It is preferable to have the high melting interconnection on the die, particularly dies having underfill, to avoid degradation of the die/substrate interconnection in subsequent thermal processing steps.

One problem associated with the flip chip packaging technique employing a plastic or organic substrate is that the interconnect processing temperature cannot be higher than the degradation temperature of the substrate, without adversely compromising the mechanical integrity of the substrate. To circumvent the need for high temperature to reflow the high lead solder bumps on the die, organic substrates are typically coated with eutectic solder (solders containing 63 wt. % Sn and 37 wt. % Pb) which melts at 183° C. When the high melting bumps 12 on die 10 are physically placed on eutectic solder pads on an organic substrate, reflowing the assembly at or above 183° C. melts the eutectic solder on the substrate which causes the molten eutectic to react with the solder bumps on the die to form a joint at a relatively lower temperature then the melting temperature of the high lead solder on the die.

Subsequent processing steps involve, for example, thermally attaching the die/substrate assembly to a circuit board. Thermal treatment during the regular manufacturing, however, may cause electrical discontinuity between the previously formed die and substrate interconnect. This leads to an interruption in the joint continuity and a gradual increase in the joint electrical resistance with time, particularly under high stress treatment. Even during the daily use of the package in a finished product, a large portion of heat energy generated during operation of the device is dissipated to the supporting substrate through the solder joints. The flow of heat energy through the joint establishes thermal gradients in the solder joints which lead to thermal migration of solder atoms in the interconnection, eventually resulting in discontinuity of the interconnection resulting in long-term filed reliability problems.

Accordingly, there is a continual need in semiconductor packaging technology for an improved solder interconnection that will resist thermal degradation and also exhibit long-term stability under normal operation and under high stress conditions.

SUMMARY OF THE INVENTION

An advantage of the present invention is an organic carrier member having solder alloys containing a low amount of tin that are suitable for mounting a semiconductor device.

Another advantage of the present invention is a device assembly that maintains reliable electrical connections under repeated heating and cooling cycles that occur during its normal operation.

Additional advantages and features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a carrier member for mounting a semiconductor device, such as an integrated circuit die, a capacitor, etc. The carrier member comprises: an organic substrate having a surface; a plurality of solder pads on the surface of the organic substrate that are suitable for receiving a device to be mounted thereto; and a plurality of electrical connections which are in electrical communication with the solder pads on the surface of the organic substrate.

Advantageously, the solder pads on the organic substrate comprise a low weight percent (wt. %) of tin (Sn). The solder pads preferably have a reflow temperature of less than about the decomposition temperature of the organic substrate. The organic substrate can comprise polyphenylene sulfide, polysulphone, polyethersulphone, polyarylsulphone, phenol, polyamide, bismaleimide-triazine, epoxy or mixtures thereof with optionally fiberous materials, such as glass fibers, to fabricate a laminated structure with internal wiring connecting the solder pads with the electrical connections on the organic substrate. Alternatively, the organic substrate can be fabricated by any of the above resins, or mixtures thereof in to a non-laminated structure, such as a molded plastic part with internal wiring.

The solder pads of the present invention advantageously reflow at a temperature less than about the degradation temperature of the organic substrate. The electrical connections on the organic substrate may be employed to form external connections, such as ground or power connections, and can be in the form of metallized contacts, solder balls or pins.

Another aspect of the present invention is a device assembly comprising a device and a supporting organic carrier member. The device of the present invention can be an integrated circuit die having a plurality solderable conductive contacts thereon. In accordance with the present invention, the solderable conductive contacts of the device are in electrical communication and connected to the solder pads on the organic carrier member to form the device assembly.

Another aspect of the present invention is a method of manufacturing device assembly. The method comprises aligning a semiconductor device having a plurality of solderable conductive contacts thereon with a carrier member, such that the solderable conductive contacts of the device are aligned with the solder pads on the top surface of the organic substrate of the carrier member; and forming an electrical connection between the contacts of the device and the organic substrate. The electrical connection can advantageously be formed by the application of infrared radiation, a flow of dry heated gas, such as in a belt furnace, to reflow the solder pads on the organic substrate preferably below the degradation temperature of the substrate and form electrical and mechanical interconnections between the device and substrate to interconnect the assembly.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawing and description are to be regarded as illustrative in nature, and not as restrictive.

DESCRIPTION OF THE INVENTION

Figure 1:
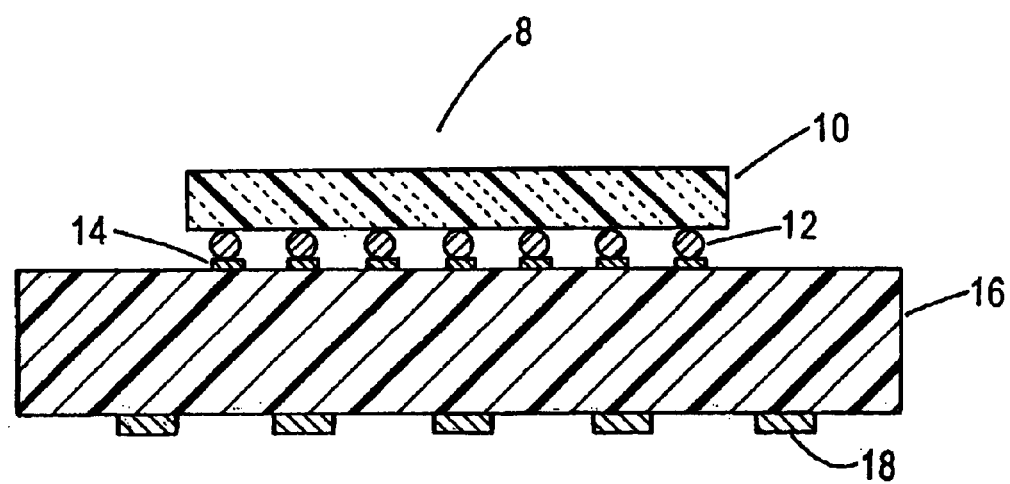
FIG. 1 schematically depicts a conventional flip chip assembly.

The present invention stems from the discovery that employing solder pads containing a low tin content on an organic carrier member improves the electrical reliability of the interconnections formed between a semiconductor device and the organic carrier member. In particular, it was discovered that solder alloys having a low tin content could be prepared that reflowed below the degradation temperature of the organic substrate and formed reliable electrical and mechanical connections to a semiconductor device.

In order to address the difficulty of providing a reliable interconnection between a semiconductor device and an organic carrier member, an understanding of the causes of such problems was undertaken. In this regard the assembly of flip chip was evaluated.

In the flip chip process, solder bumps are formed over bonding pads of a semiconductor device. Metal layers are provided between the solder bump and bonding pad of the device, i.e. under bump metallurgy, to promote adhesion of the solder, ensure wettability by the solder and provide a barrier between the solder and the underlying device. Examples of under bump metallurgy include one or more layers of chrome, copper and gold. Other examples of metal layers used in under bump metallurgy include one or more layers of nickel and gold; one or more layers of titanium and copper; or alloys thereof.

After investigation, it was discovered that solder pads containing high concentrations of tin, such as those conventionally employed in eutectic coatings for organic packages, deleteriously affects the interconnection formed between a bump device and the supporting substrate. Upon further investigation, it was discovered that although tin in a eutectic formulation desirably forms an intermetallic with the solder bumps of the device at low temperatures, substantial amounts of tin remain available to undesirably interact with the under bump metallurgy on the device. It is believed that the available tin migrates to the underside of the device and deleteriously interacts with the under bump metallurgy on the device increasing electrical resistance, corrupting the joint integrity and, in severe circumstances, causing failure of the interconnection. It is believed that tin migrates around the solder bumps of the device after completing the connection to the organic substrate to consume or otherwise deleteriously interact with the under bump metallurgy. It is believed that migration of tin can occur during thermal processes to form interconnections between the carrier member and a circuit board or even during normal operation of the finished assembly thereby reducing the reliability of the device in operation.

A four component solder is suitable for the present invention. For example, a solder comprising lead (Pb), tin (Sn), bismuth (Bi) and antimony (Sb) can be used for solder pads on an organic substrate. Although the use of bismuth in a solder is known, it is believed that bismuth/tin solders contain low melting components, i.e., these solders contain components that melt under 100° C. The use of solders with low melting components would be less desirable in terms of process uniformity, although certain processing steps can be adjusted to account for these components. It was found, however, that when bismuth is used in the four component system, such as in a Pb, Sn, Bi, Sb solder, low melting components can be reduced or eliminated.

The present invention can improve the interactions between the device and the solder on an organic carrier member by forming solder pads on an organic carrier member that contain low amounts of tin, e.g., no greater than about 20 wt. % tin. The solder pads of the present invention comprise solder alloys such that there is substantially little tin available to migrate from the carrier member to the device, yet the alloys of the present invention still desirably interact with the device to form electrical interconnections preferably below the degradation temperature of the organic substrate. The interconnections formed by the solders of the present invention are advantageously capable of undergoing many temperature cycles without discontinuity over the life-time operation of the device.

Figure 2:
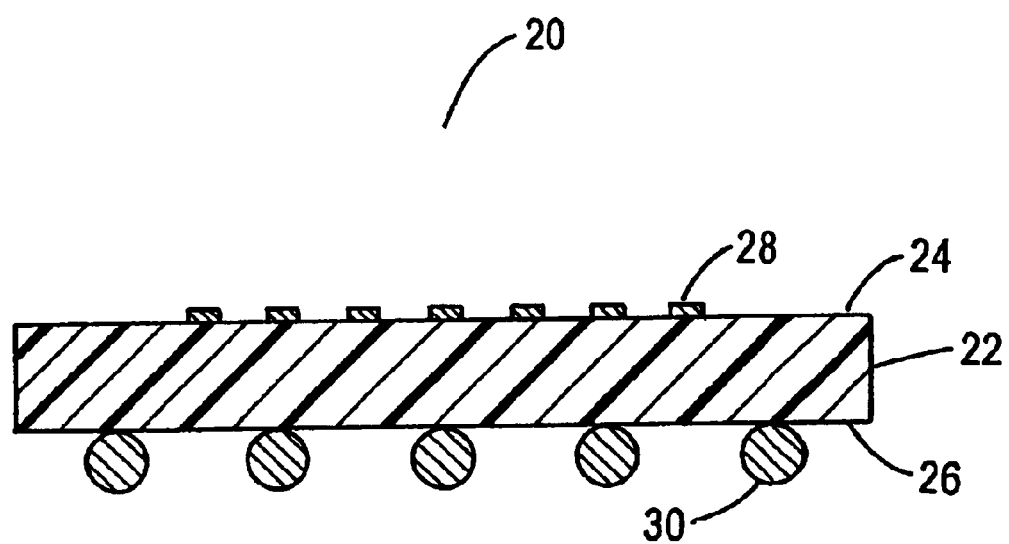
FIG. 2 schematically illustrates a sectional view of an embodiment of an organic carrier member.

FIG. 2 illustrates an embodiment of an organic carrier member of the present invention. As illustrated, carrier member 20 comprises an organic substrate 22 having a top surface 24 and a bottom surface 26. An array of solder pads 28 of the present invention are formed on the top surface 24 of organic substrate 22 for receiving a device (not shown). The array of solder pads 28 are patterned to correspond to the metallization pattern of a give device to be mounted on top surface 24 of organic substrate 22.

In an embodiment of the present invention, organic substrate 22 electrical connections in the form of solder bumps. Solder bumps 30 on the bottom surface 26 of organic substrate 22 are in electrical communication with solder pads 28 by an internal conductive structure, i.e. internal wiring (not shown for illustrative convenience). As shown in FIG. 2., the electrical connections are in the form of an array of solder bumps for surface mounting the carrier member to a printed circuit board. The electrical connections for externally connecting the organic substrate can also be in the form of metallized contacts or pins, for example.

Figure 3:
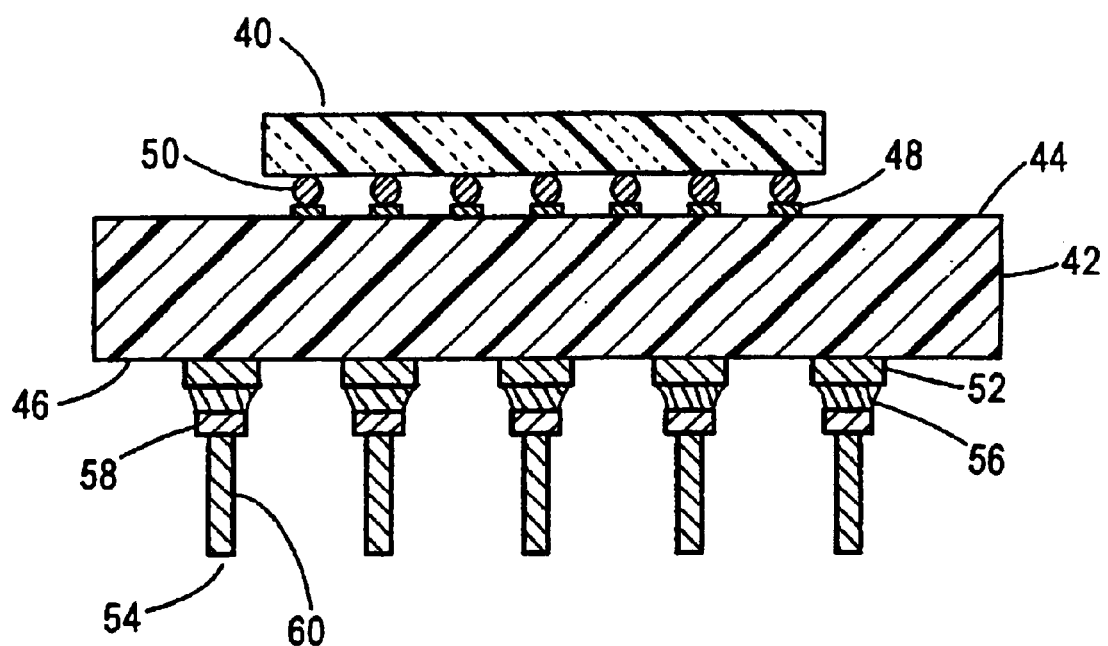
FIG. 3 illustrates an embodiment of a device assembly.

FIG. 3 illustrates an embodiment of a device assembly. As shown in this embodiment, a device assembly comprises a semiconductor device 40 on a carrier member of the invention having a plurality of I/O pin connections. As illustrated, the carrier member comprises an organic substrate 42 having a top surface 44 and a bottom surface 46. An array of conductive contacts, e.g. solder pads 48, are formed on the top surface 44 of organic substrate 42 for directly receiving device 40 which has a plurality of solderable contacts 50, i.e. solder bumps. The array of solder pads 48 are patterned to correspond to solderable contacts 50 to be mounted thereto. A plurality of conductive pads 52 extend from the bottom surface 46 of organic substrate 42 are in electrical communication with solder pads 48 by an internal conductive structure, i.e. internal wiring (not shown for illustrative convenience). Leads 54 are mechanically and electrically joined to conductive pads 52 by solder fillets 56. Pins 54 comprise pin heads 58, joined to conductive pads 52 by solder fillets 56 and pin shafts 60.

In practicing an aspect of the invention, solder alloys can be formed as discrete solder pads on the organic substrate by conventional solder pad forming techniques such as screen printing, dispensing, or electroplating solder of the present invention on the surface of the organic substrate. The solder pads of the present invention can be shaped as a hemisphere, dome, cylindrical column, pedestal, stud, post, flat rectangular, hourglass, or pyramid structures. The array of solder pads on the organic substrate is arranged to align and correspond to the particular semiconductor device to be mounted thereon. Given the guidance and objectives of the present disclosure, the optimum solder compositions and organic substrate can be necessarily determined for particular carrier member.

In accordance with an aspect of the present invention, an organic substrate is provided having a plurality of solder pads on the surface thereof for receiving a device such that the solder pads comprise a low amount of tin e.g., no greater than about 20 wt. % tin. In an embodiment of the present invention, the solder pads also contain bismuth, e.g. between about 2 wt. % to 16 wt. % bismuth. In one aspect of the present invention, solder alloys are prepared comprising no greater than about 15 wt. % tin, e.g., about 10 wt. % tin and from about 6–14 wt. % bismuth. Suitable solder compositions can be formulated, for example, comprising about 85 wt. % to about 80 wt. % lead, about 12 wt. % to about 6 wt. % antimony, about 10 wt. % to about 3 wt. % tin and up to about 5 wt. % silver. Other suitable compositions include about 85 wt. % to about 82 wt. % lead, about 12 wt. % to about 8 wt. % antimony, about 10 wt. % to about 3 wt. % tin and up to about 5 wt. % silver. Still other suitable compositions include about 85 wt. % to about 65 wt. % lead, about 12 wt. % to about 6 wt. % antimony, about 10 wt. % to about 3 wt. % tin and about 2 wt. % to about 15 wt. % bismuth.

In accordance with an aspect of the present invention, formulated solder alloys are formed as solder pads on an organic substrate for interconnecting a semiconductor device to the organic substrate. In an embodiment of the present invention, the solder on the organic substrate has reflow temperature, i.e. the temperature which the solder is mobile enough to form an electrical connection, of no greater than about 270° C., e.g. no greater than about 260° C.

Table 1 below provides solder alloys together with their melting characteristics that are suitable for forming solder pads on organic substrates in accordance with the present invention. Table 1 further shows the melting characteristics of a conventional alloy having a high tin content, for comparison.

TABLE 1

| | Alloy (wt. %) | Solidus (° C.) | Liquidus (° C.) | |
|---|---|---|---|---|
| | | | Major | Minor |
| 1 | 95 Sn/5 Sb (conventional Alloy) | 237 | 243 | — |
| 2 | 83 Pb/10 Sb/5 Sn/2 Ag | 237 | 239 | 248 |
| 3 | 85 Pb/11.5 Sb/3.5 Sn | 240 | 245 | 248 |
| 4 | 85 Pb/10 Sb/5 Sn | 240 | 245 | 253 |
| 5 | 82 Pb/8 Sb/10 Sn | 244 | 245 | 257 |
| 6 | 70 Pb/8 Sb/10 Sn/12 Bi | 192 | 223 | 249 |

The solder pads of the present invention further advantageously have a reflow temperature which does not compromise the integrity of the organic substrate. In an embodiment of the present invention, the organic substrate comprises a high temperature stable polymeric material, such as sulphone, polylsulphone, phenol, polyamide, bismaleimide-triazine, epoxy or mixtures thereof. Polyimides are radiation resistant high temperature stable materials that can be prepared as laminates for organic packages. For example, polyimide itself has a decomposition temperature of over 300° C.

Polyimides can further be copolymerized with one or more imide subsituted monomers to enhance dielectric and/or thermal properties. Typical monomers that can be copolymerized with polyimides include amides, phenolics, bismaleimide, epoxies and esters to form the corresponding polyimide copolymers.

The organic substrate of the present invention can be fabricated in the form of a molded part or as a laminated structure. A laminated structure with internal wiring connecting the solder pads with the leads at the bottom of the structure can be fabricated having one or more conductive layers and insulating polymer layers with optionally fiberous materials, such as glass fibers. For example, the organic substrate can be fabricated from an organic epoxy-glass resin based material, such as bismaleimide-triazine (BT) resin or FR-4 board laminate having a high thermal decomposition temperature.

In an embodiment of the present invention, the organic substrate comprises a bismaleimide-triazine epoxy laminate structure having a plurality of solder pads on the top surface thereof. In this embodiment, the solder pads on the laminate comprises no more than about 20 wt. % tin and between about 10–14 wt. % bismuth. The pads preferably have a reflow temperature of no greater than about 270° C.

In practicing the invention, a device assembly can be prepared by aligning a device having a plurality of conductive contacts thereon with the solder pads on the top surface of the organic substrate of the present invention. The device can be any device having a solderable conductive contact thereon. For example, the device can be a high lead solder bumped IC, e.g. 97–95 wt. % lead/3–5 wt. % tin, or a bumped capacitor, or any other device having a solderable conductive contact. Between the high lead solder bump and the device can be under bump metallurgy, i.e. one or more layers or an alloy of chrome, copper, gold, titanium, nickel, etc.

Once the carrier member of the present invention is aligned with the device, an electrical interconnection is formed between the device and the carrier member of the present invention. The electrical connection can be formed by the application of infrared radiation, a flow of dry heated gas, such as in a belt furnace, or a combination thereof, to reflow the solder pads on the organic substrate and interconnect the device and carrier member. In an embodiment of the present invention, the solder pads on the carrier member are reflowed by a process of heating the organic carrier member from about 190° C. to about 270° C., e.g. heating the carrier member to about 250–230° C., by a process of a combined infrared/convection heater.

The solder pads used to join a semiconductor device to the organic substrate preferably has a reflow temperature that is lower than the temperature of other soldered joins on the substrate, such as solders joining pin leads. In the embodiment of present invention, the temperature difference between reflowing the solder pads and solder alloy joining other electrical contacts, i.e. pins, is no less than approximately 5° C. and preferably higher, e.g. no less than about 10–15° C. and preferably higher. For example and by illustration in FIG. 3, solder fillets 56 can have the composition of formula 5 in Table 1 while solder pads 48 can have formulation 6 in Table 1. The temperature difference between the liquidus major is about 22° C.

In an embodiment of the present invention, a device assembly is prepared by providing a substrate comprising a bismaleimide-triazine epoxy laminate having an array of solder pads on the top surface thereof and an array of leads extending from the bottom surface and in electrical communication with the solder pads on the top surface. A semiconductor device is then aligned with the array of solder pads on the top surface of the substrate, wherein the solder pads comprises no more than about 20 wt. % tin and has a reflow temperature of no greater than about 270° C.

The process steps and structures described above do not form a complete process flow for manufacturing device assemblies or the packaging of integrated semiconductor devices. The present invention can be practiced in conjunction with electronic package fabrication techniques currently used in the art, and only so much of the commonly practiced process steps are included as are necessary for an understanding of the present invention. The figures representing cross-sections of portions of electronic package fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A carrier member suitable for mounting a semiconductor device, the member comprising:

an organic substrate having a surface;

a plurality of solder pads on the surface of the organic substrate for directly receiving a semiconductor device to be mounted thereto, wherein the solder pads comprises no more than about 20 wt. % tin and have a reflow temperature of no greater than about the decomposition temperature of the organic substrate; and a plurality of electrical connections on the organic substrate which are in electrical communication with the solder pads on the surface of the organic substrate.

2. The carrier member of claim 1, wherein the solder pads comprise between about 2 wt. % to about 16 wt. % bismuth.

3. The carrier member of claim 1, wherein the solder pads comprise about 85 wt. % to about 65 wt. % lead, about 12 wt. % to about 6 wt. % antimony, about 10 wt. % to about 3 wt. % tin and about 2 wt. % to about 15 wt. % bismuth.

4. The carrier member of claim 3, wherein the organic substrate is a laminated structure and the electrical connections are in the form of pins.

5. The carrier member of claim 1, wherein the solder pads comprise about 70 wt. % lead, about 8 wt. % antimony, about 10 wt. % tin and about 12 wt. % bismuth.

6. A device assembly, the assembly comprising:

the carrier member of claim 1; and a semiconductor device having a plurality of solderable conductive contacts thereon, wherein the solderable conductive contacts of the semiconductor device are in electrical communication with the carrier member through the solder pads on the substrate.

7. The device assembly of claim 6, wherein the solderable contacts comprise solder bumps.

8. The device assembly of claim 6, wherein the device is an integrated circuit die.

9. A carrier member for mounting a device, the member comprising:
   an organic substrate having a top surface and a bottom surface;
   a plurality of solder pads on the top surface of the organic substrate for directly receiving the device to be mounted thereto, wherein the solder pads comprises no more than about 20 wt % tin and have a reflow temperature of no greater than about the decomposition temperature of the organic substrate; and
   a plurality of electrical connections on the bottom surface of the organic substrate which are in electrical communication with the solder pads on the top surface of the organic substrate.

10. The carrier member of claim 9, wherein the solder pads comprise no more than about 10 wt. % tin.

11. The carrier member of claim 9, wherein the solder pads comprise about 85 wt. % to about 82 wt. % lead, about 12 wt. % to about 8 wt. % antimony, about 10 wt. % to about 3 wt. % tin and up to about 5 wt. % silver.

12. The carrier member of claim 9, wherein the reflow temperature of the solder pads is no greater than about 270° C.

13. The carrier member of claim 9, wherein the organic substrate comprises a laminated structure or a molded plastic.

14. The carrier member of claim 9, wherein the organic substrate comprises polyphenylene sulfide, polysulphone, polyethersulphone, polyarylsulphone, phenol, polyamide, bismaleimide-triazine, epoxy or mixtures thereof.

15. The carrier member of claim 9, wherein the electrical connections are in the form of metallized contacts, solder balls, or pins.

16. A carrier member for mounting a bumped die, the member comprising:
   a substrate comprising a bismaleimide-triazine epoxy laminate having a surface;
   a plurality of solder pads on the surface of the substrate for directly receiving a bumped die to be mounted thereto, wherein the solder pads comprise no more than about 20 wt. % tin; and
   a plurality of electrical connections on the substrate which are in electrical communication with the solder pads on the surface of the substrate.

17. The carrier member of claim 16, wherein the solder pads further comprise arsenic, lead, and from about 2 wt. % to about 16 wt. % bismuth and wherein the electrical connections are in the form pins.

* * * * *